(12) United States Patent
Chou (10) Patent No.: US 7,887,997 B2
(45) Date of Patent: Feb. 15, 2011

(54) MANUFACTURING METHOD FOR CONDUCTING FILMS ON TWO SURFACES OF TRANSPARENT SUBSTRATE OF TOUCH CONTROL CIRCUIT

(75) Inventor: Wei-Ping Chou, Changhua (TW)

(73) Assignee: TPK Touch Solutions Inc., Taipei (TW)

( * ) Notice: Subject to any disclaimer, the term of this patent is extended or adjusted under 35 U.S.C. 154(b) by 529 days.

(21) Appl. No.: 12/117,814

(22) Filed: May 9, 2008

(65) Prior Publication Data

US 2009/0246704 A1 Oct. 1, 2009

(30) Foreign Application Priority Data

Mar. 28, 2008 (TW) .............................. 97111246 A (51) Int. Cl.
*G03F 7/26* (2006.01)
(52) U.S. Cl. .................. 430/312; 430/22; 430/318; 430/319
(58) Field of Classification Search ........................ None
See application file for complete search history.

(56) References Cited

U.S. PATENT DOCUMENTS 6,342,330 B2 1/2002 Watanabe et al.
6,551,859 B1 4/2003 Lee et al.
6,653,055 B1 11/2003 Meier et al.
2007/0048626 A1* 3/2007 Megens ..................... 430/5
2007/0154842 A1 7/2007 Kwon
2008/0176042 A1* 7/2008 Nashiki et al. ............. 428/172

FOREIGN PATENT DOCUMENTS

GB 2277382 A 10/1994
JP 56-140322 A * 11/1981

* cited by examiner

*Primary Examiner*—John A. McPherson
(74) *Attorney, Agent, or Firm*—Chun-Ming Shih (57) ABSTRACT

A manufacturing method for conducting films on two opposite surfaces of a transparent substrate of a touch control circuit, includes: contacting a first photoresist layer having photosensitive and discolored emulsion on a first conducting coat formed on a first surface of the transparent substrate, and contacting a second photoresist layer on a second conducting coat formed on a second surface of the transparent substrate; exposing the first photoresist layer to form a circuit pattern with distinguishable color on exposed regions of the first photoresist layer; employing the circuit pattern as an aligning benchmark for the second photoresist layer, and exposing the second photoresist layer accordingly; developing and etching those arranged on the two surfaces of the transparent substrate at the same time to form a first conducting film of a touch control circuit from the first conducting coat and form a second conducting film of the touch control circuit from the second conducting coat. Thus the manufacturing steps of the touch control circuit are decreased.

10 Claims, 6 Drawing Sheets

MANUFACTURING METHOD FOR CONDUCTING FILMS ON TWO SURFACES OF TRANSPARENT SUBSTRATE OF TOUCH CONTROL CIRCUIT

BACKGROUND

1. Field of the Invention

The present invention relates to a manufacturing method for a touch control circuit, and more specifically, to a method for manufacturing conducting films of a touch control circuit on two opposite surfaces of a transparent substrate by sputtering, exposure, developing, and etching methods.

2. Description of the Related Art

Conventional touch panels are generally divided into resistive touch panels and capacitive touch panels. The resistive touch panels are used by figure, pen or other medium pressing the surface thereof to generate touch control signals. The capacitive touch panels are used by the figure touching the surface thereof to generate the touch control signals. Thus, the capacitive touch panels are more sensitive than the resistive touch panels. Therefore, the touch panels of current advanced electronic devices, such as mobile phone, global positioning system (GPS), personal digital assistant (PDA), palm-sized PC, or information appliance, etc., are mostly the capacitive touch panels. The capacitive touch panels have a touch control circuit arranged therein, which is manufactured by using sputtering, exposure, developing, and etching methods to stack transparent conducting indium tin oxide (ITO) in series on two opposite surfaces of a glass substrate. The touch control circuit includes an upper conducting film formed on a top surface of the transparent substrate, and a lower conducting film formed on a bottom surface of the transparent substrate. Thus, a capacitive effect is produced between the upper, lower conducting films and the body of people, to generate an induced current, which can be used to calculate the coordinate value of a touch control position.

Furthermore, the typical manufacturing method for the above touch control circuit includes vacuum sputtering an upper conducting material and a lower conducting material on top and bottom surfaces of a glass substrate respectively; contacting an upper photoresist layer on the upper conducting material, and contacting a protective layer on the lower conducting material; shielding the photoresist layer with a mask having empty circuit patterns, and exposing the upper photoresist layer by ultra-violet (UV) light through the mask having the empty circuit patterns; developing the upper photoresist layer by a developer to expose a region of the upper conducting material, which should be etched; etching the exposed upper conducting material in an etchant to form an upper conducting film, and removing the residual photoresist layer on the upper conducting film and the protective layer on the lower conducting material; next, contacting a lower photoresist layer on the lower conducting material and contacting another protective layer on the upper conducting film; shielding the lower photoresist layer on the lower conducting material with another mask having empty circuit patterns, using the upper conducting film as an aligning benchmark for the lower photoresist layer, aligning the mask by images of the upper conducting film obtained by an image pick-up device, such as CCD, exposing the lower photoresist layer by the UV light through the mask having the empty circuit patterns; developing the lower photoresist layer by a developer to expose an etching region of the lower conducting material, which should be etched; etching the exposed region of the lower conducting material in the etchant, to form a lower conducting film, and removing the residual photoresist layer on the lower conducting film and the protective layer on the upper conducting film.

However, the typical manufacturing method for the touch control circuit must repeat the steps of contacting and removing the photoresist layer, and/or the protective layer, and repeat the developing and/or etching processes. Thus, the typical manufacturing method consumes more manufacturing time and cost.

What is needed, is providing a manufacturing method for a touch control circuit, which can solve the above problems.

BRIEF SUMMARY

A manufacturing method for conducting films on two opposite surfaces of a transparent substrate of a touch control circuit in accordance with an exemplary embodiment of the present invention, is provided. The manufacturing method includes:

contacting a first photoresist layer having photosensitive and discolored emulsion on a first conducting coat formed on a first surface of the transparent substrate, and contacting a second photoresist layer on a second conducting coat formed on a second surface of the transparent substrate;

exposing the first photoresist layer to form a circuit pattern with distinguishable color on exposed regions of the first photoresist layer;

employing the circuit pattern as an aligning benchmark for the second photoresist layer, and exposing the second photoresist layer accordingly;

developing the photoresist layers on the two surfaces of the transparent substrate at the same time to expose regions of the first conducting coat and the second conducting coat, which should be etched;

etching the exposed regions of the first conducting coat and the second conducting coat at the same time to form a first conducting film of a touch control circuit from the first conducting coat and form a second conducting film of the touch control circuit from the second conducting coat.

Therefore, the conducting films on the two surfaces of the transparent substrate can be formed in a single developing and etching process, thus the manufacturing steps of the touch control circuit are decreased and the manufacturing time and cost are decreased.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Reference will now be made to the drawings to describe exemplary embodiments of the present manufacturing method for a touch control circuit, in detail. The following description is given by way of example, and not limitation.

Figure 1:
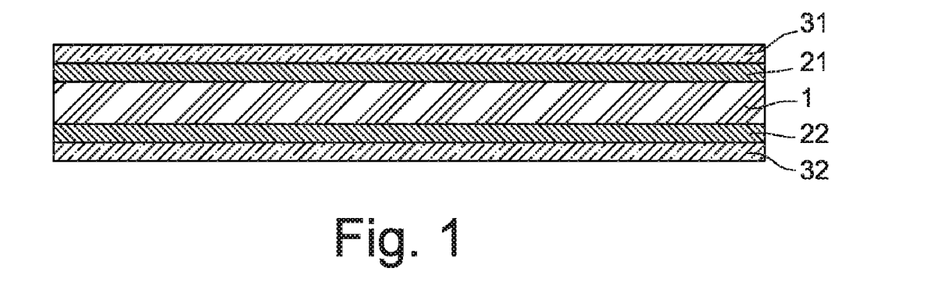
FIG. 1 is a schematic, crossed view of a manufacturing method for conducting films on two surfaces of a transparent substrate of a touch control circuit, in accordance with an exemplary embodiment of the present invention, which contact first and second positive photoresist layers on first and second conducting coats formed on two opposite surfaces of the transparent substrate.

FIG. 1 is a schematic, crossed view of a state, in accordance with an exemplary embodiment of the present invention. FIG. 1 cooperating with FIGS. 2 to 6, shows a manufacturing method of conducting films on two opposite surface of a transparent substrate of a touch control circuit, in accordance with the exemplary embodiment of the present invention. The manufacturing method includes following steps:

Step (1) is arranging a transparent substrate 1 into a sputtering device and then vacuum sputtering a first conducting coat on a first surface of the transparent substrate 1. In this exemplary embodiment, the first surface of the transparent substrate 1 is the top surface of the transparent substrate 1. The first conducting coat is an upper conducting coat 21 (as shown in FIG. 1) formed on the top surface of the transparent substrate 1. At the same time, a second conducting coat is sputtered on a second surface of the transparent substrate 1. In this exemplary embodiment, the second surface of the transparent substrate 1 is the bottom surface of the transparent substrate 1. The second conducting coat is a lower conducting coat 22 formed on the bottom surface of the transparent substrate 1. The transparent substrate 1 may be made of glass, adhesive film or glue cover. Furthermore, the transparent substrate 1 is essentially a transparent substrate of a touch panel. Alternatively, the transparent substrate 1 may be an upper transparent substrate of a display panel. The upper conducting coat 21 and the lower conducting coat 22 are made of transparent conducting material respectively. The transparent conducting material may be indium tin oxide (ITO) or other conducting material, and are coated on the top and bottom surfaces of the transparent substrate 1 by the sputtering method or other similar methods.

Step (2) is contacting a first photoresist layer 31 (as shown in FIG. 1) having photosensitive and discolored emulsion on the upper conducting coat 21, and contacting a second photoresist layer 32 on the lower conducting coat 22. This contacting step may be performed by coat, spraying or other methods. In this exemplary embodiment, the first photoresist layer 31 and the second photoresist layer 32 are positive photoresist. Regions of the positive photoresist irradiated by the UV light are dissolved in a developer, and regions of the positive photoresist not irradiated by the UV light, are difficult to be dissolved in the developer, such that the regions of the positive photoresist not irradiated by the UV light will be remained. The photosensitive and discolored emulsion is made of organic double band alkenes material, and may change its color after being irradiated by the UV light.

Figure 2:
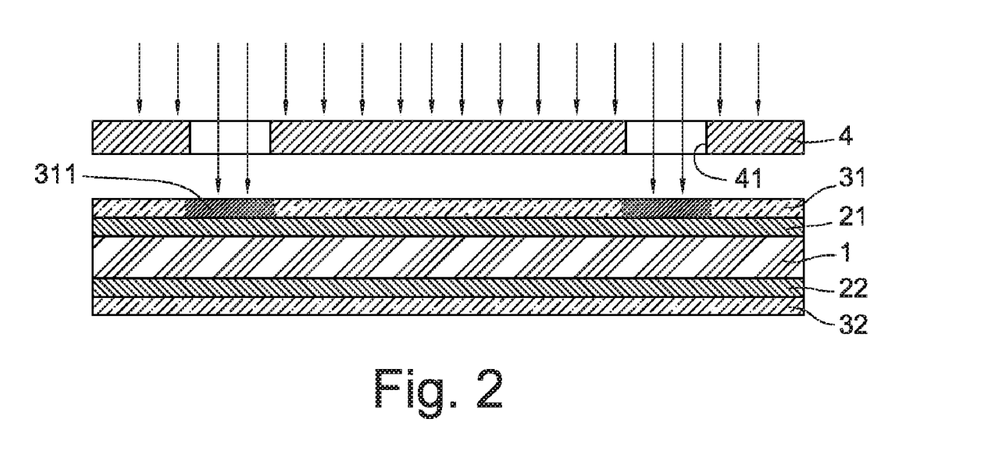
FIG. 2 is a schematic, crossed view of the manufacturing method, which exposes the first photoresist layer by a first mask.

Step (3) is shielding the first photoresist layer 31 with a first mask 4 (as shown in FIG. 2) having an empty circuit pattern 41, employing an UV light source to provide the UV light and irradiate the first photoresist layer 31 through the empty circuit pattern 41, such that the first photoresist layer 31 is exposed and exposed regions of the first photoresist layer 31 form a circuit pattern 311 with distinguishable color. Since the photosensitive and discolored emulsion has a low sensitive capability, color difference of the photoresist layer will be formed in the exposure to form the distinguishable color with the distinguishable effect.

Figure 3:
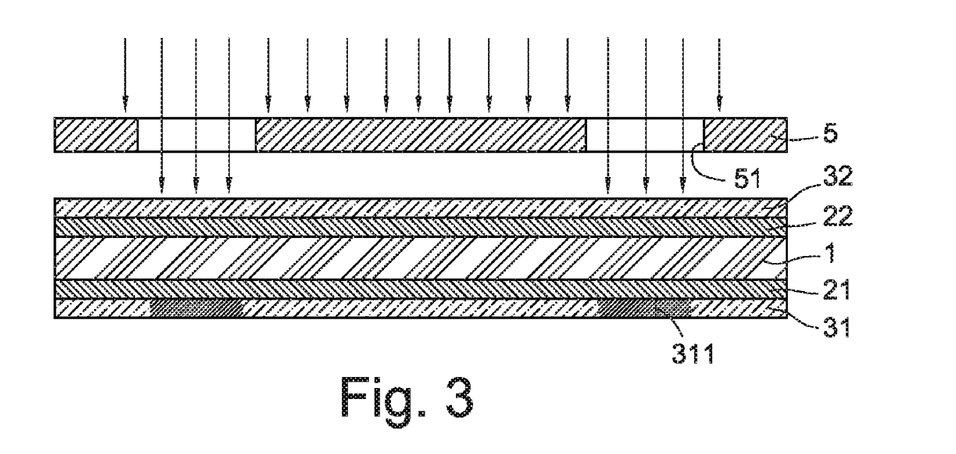
FIG. 3 is a schematic, crossed view of the manufacturing method, which exposes the second photoresist layer by a second mask.

Step (4) is turning over the transparent substrate 1 to make the second photoresist layer 32 upwards (as shown in FIG. 3); shielding the second photoresist layer 32 with a second mask 5 having another empty circuit pattern 51, and employing the circuit pattern 311 as an aligning benchmark of the second mask 5 and the second photoresist layer 32; achieving images of the circuit pattern 311 by using an image contrast device (for example, CCD) to distinguish the color difference of the circuit pattern 311, and aligning the second mask 5 to adjust the position of the mask 5, which adjacent to the second photoresist layer 32; employing the UV light source to provide the UV light and irradiating the second photoresist layer 32 through the empty circuit pattern 51 to expose the second photoresist layer 32.

Figure 4:
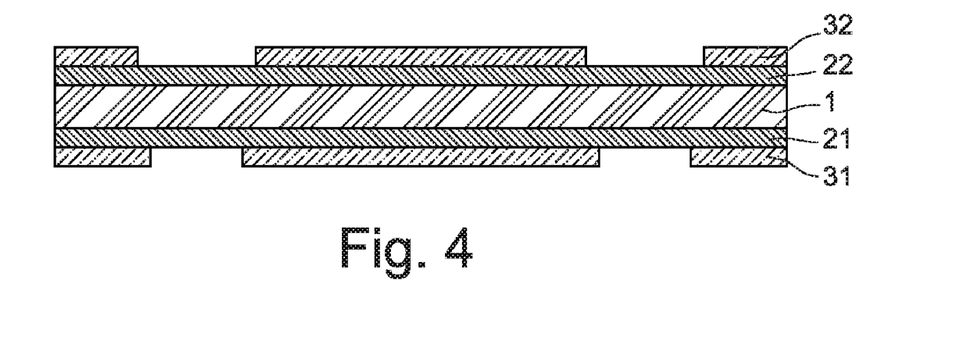
FIG. 4 is a schematic, crossed view of the manufacturing method, which develop the first and second photoresist layers at the same time.

Step (5) is contacting the first photoresist layer 31 and the second photoresist layer 32 with a developer to develop the photoresist layers on the two surfaces of the transparent substrate 1. Thus the regions of the first photoresist layer 31 and the second photoresist layer 32, which are irradiated by the UV light, are dissolved in the developer to expose regions of the upper conducting coat 21 and the lower conducting coat 22 respectively, which should be etched in following steps.

Figure 5:
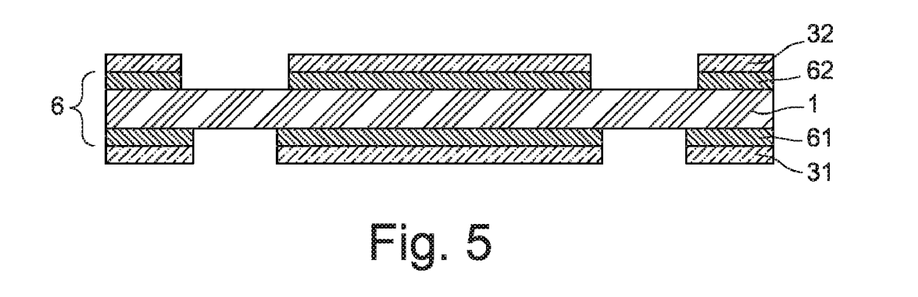
FIG. 5 is a schematic, crossed view of the manufacturing method, which etch the first and second conducting coats to form first and second conducting films.

Step (6) is immersing the transparent substrate 1 into an etchant to etch the conducting coats on the two surfaces of the transparent substrate 1 at the same time. Thus the exposed regions of the upper conducting coat 21 and the lower conducting coat 22 are dissolved in the etchant (as shown in FIG. 5) to form a first conducting film of a touch control circuit 6 from the upper conducting coat 21 and form a second conducting film of the touch control circuit 6 from the lower conducting coat 22. In this exemplary embodiment, the first conducting film is an upper conducting film 61 from the upper conducting coat 21, and the second conducting film is a lower conducting film 62 from the lower conducting coat 22.

Figure 6:
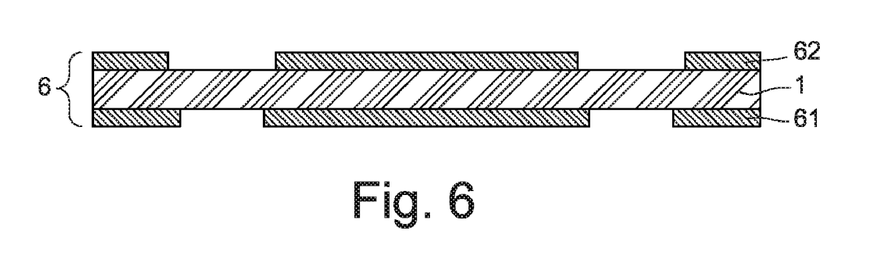
FIG. 6 is a schematic, crossed view of the manufacturing method, which remove the residual first and second photoresist layers to expose completely the first and second conducting films.

Step (7) is contacting the residual photoresist layer 31 on the upper conducting film 61 and the residual photoresist layer 32 on the lower conducting film 62 with an photoresist-removing solvent to remove the residual first and second photoresist layers 31 and 32 on the upper and lower conducting films 61 and 62 at the same time, and expose completely the upper conducting film 61 and the lower conducting film 62.

From the above, the conducting films 61 and 62 on the two surfaces of the transparent substrate 1 are formed in a single developing and etching process, thus the manufacturing steps of the touch control circuit 6 are decreased.

In this above exemplary embodiment, the positive photoresist are used in the exposure mode to develop and remove the exposed regions of the positive photoresist. The following exemplary embodiment will illustrate negative photoresist used in the exposure mode, which is opposite to the positive photoresist. Thus, exposed regions of the negative photoresist will be remained to perform the following etching process.

Figure 7:
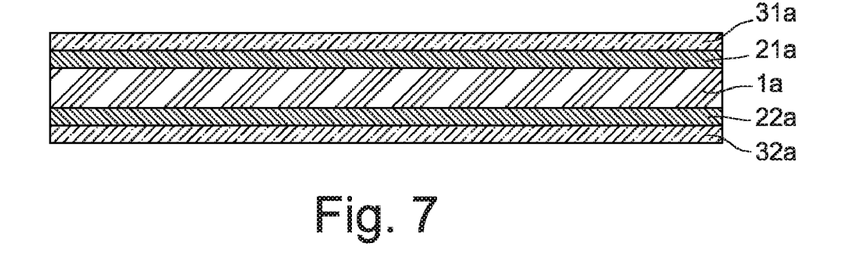
FIG. 7 is a schematic, crossed view of a manufacturing method for conducting films on two surfaces of a transparent substrate of a touch control circuit, in accordance with another exemplary embodiment of the present invention, which contact first and second negative photoresist layers on first and second conducting coats formed on two opposite surfaces of the transparent substrate.

FIG. 7 is a schematic, crossed view of a state, in accordance with another exemplary embodiment of the present invention. FIG. 7 cooperating with FIGS. 8 to 12, shows another manufacturing method of conducting films on two opposite surface of a transparent substrate of a touch control circuit, in accordance with another exemplary embodiment of the present invention. The manufacturing method includes following steps:

Step (1) is vacuum sputtering a first conducting coat on a first surface of a transparent substrate 1*a*. In this exemplary embodiment, the first surface of the transparent substrate 1*a* is the top surface of the transparent substrate 1*a*. The first conducting coat is an upper conducting coat 21*a* (as shown in FIG. 7) formed on the top surface of the transparent substrate 1*a*. At the same time, a second conducting coat is sputtered on a second surface of the transparent substrate 1*a*. In this exemplary embodiment, the second surface of the transparent substrate 1*a* is the bottom surface of the transparent substrate 1*a*. The second conducting coat is a lower conducting coat 22*a* formed on the bottom surface of the transparent substrate 1*a*. The transparent substrate 1*a* may be made of glass, adhesive film or glue cover. Furthermore, the transparent substrate 1*a* is essentially a transparent substrate of a touch panel. Alternatively, the transparent substrate 1*a* may be an upper transparent substrate of a display panel. The upper conducting coat 21*a* and the lower conducting coat 22*a* are made of transparent conducting material respectively. The transparent conducting material may be indium tin oxide (ITO) or other conducting material, and are coated on the top and bottom surfaces of the transparent substrate 1*a* by the sputtering method or other similar methods.

Step (2) is contacting a first photoresist layer 31*a* (as shown in FIG. 7) having photosensitive and discolored emulsion on the upper conducting coat 21*a*, and contacting a second photoresist layer 32*a* on the lower conducting coat 22*a*. In this exemplary embodiment, the first photoresist layer 31*a* and the second photoresist layer 32*a* are negative photoresist. Regions of the negative photoresist not irradiated by the UV light are dissolved in a developer, and regions of the negative photoresist irradiated by the UV light, are difficult to be dissolved in the developer, such that the regions of the negative photoresist irradiated by the UV light will be remained. The photosensitive and discolored emulsion is made of organic double band alkenes material, and may change its color after being irradiated by the UV light.

Figure 8:
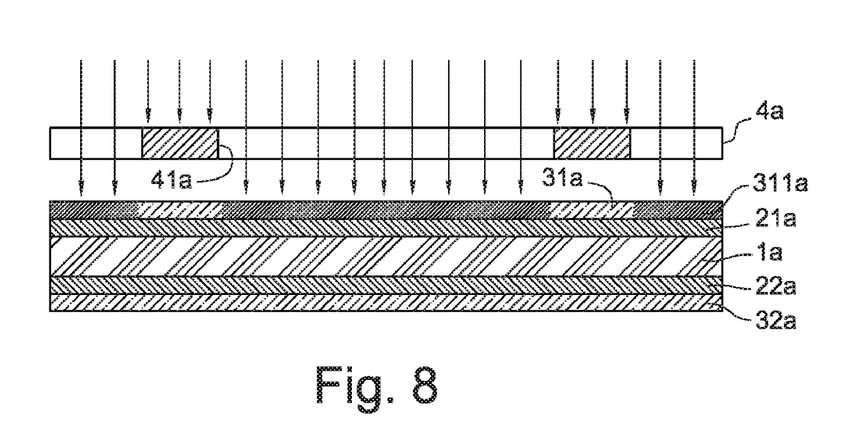
FIG. 8 is a schematic, crossed view of the manufacturing method, which exposes the first photoresist layer by a first mask.

Step (3) is shielding the first photoresist layer 31*a* with a first mask 4*a* (as shown in FIG. 8) having an empty circuit pattern 41*a*, employing an UV light source to provide the UV light and irradiate the first photoresist layer 31*a* through the empty circuit pattern 41*a*, such that the first photoresist layer 31*a* is exposed and exposed regions of the first photoresist layer 31*a* form a circuit pattern 311*a* with distinguishable color.

Figure 9:
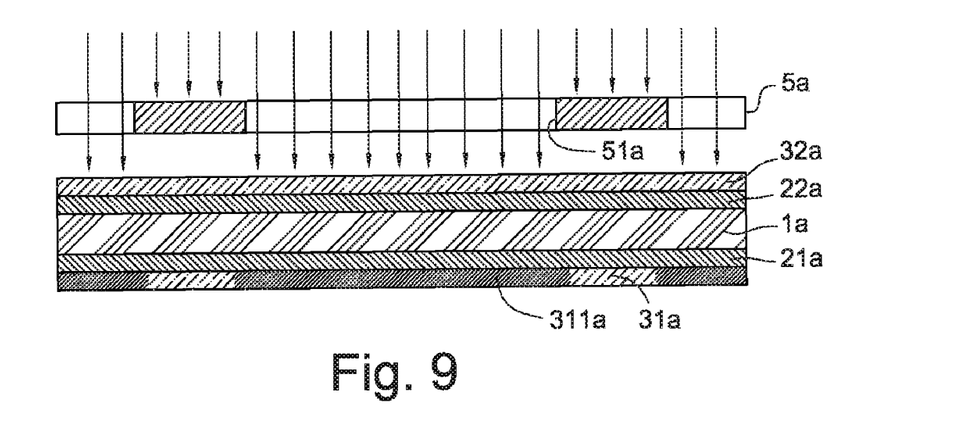
FIG. 9 is a schematic, crossed view of the manufacturing method, which exposes the second photoresist layer by a second mask.

Step (4) is turning over the transparent substrate 1*a* to make the second photoresist layer 32*a* upwards (as shown in FIG. 9); shielding the second photoresist layer 32*a* with a second mask 5*a* having another empty circuit pattern 51*a*, and employing the circuit pattern 311*a* as an aligning benchmark of the second mask 5*a* and the second photoresist layer 32*a*; achieving images of the circuit pattern 311*a* by using an image contrast device (for example, CCD) to distinguish the color difference of the circuit pattern 311*a*, and aligning the second mask 5*a* to adjust the position of the mask 5*a*, which adjacent to the second photoresist layer 32*a*; employing the UV light source to provide the UV light and irradiating the second photoresist layer 32*a* through the empty circuit pattern 51*a* to expose the second photoresist layer 32*a*.

Figure 10:
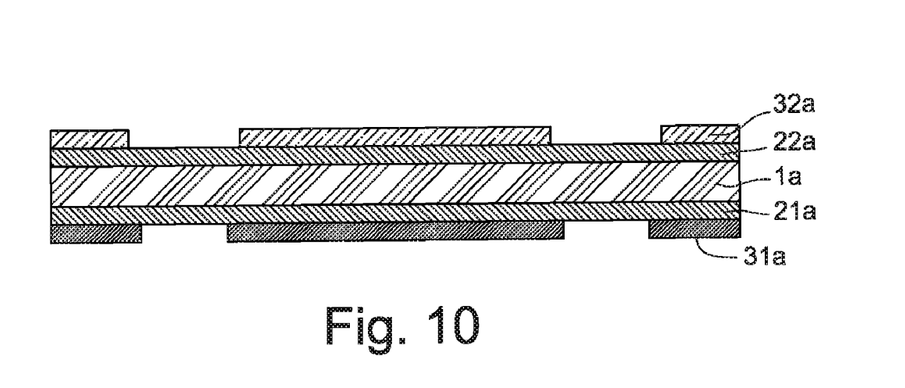
FIG. 10 is a schematic, crossed view of the manufacturing method, which develop the first and second photoresist layers at the same time.

Step (5) is contacting the first photoresist layer 31*a* and the second photoresist layer 32*a* with a developer to develop the photoresist layers on the two surfaces of the transparent substrate 1*a* at the same time. Thus the regions of the first photoresist layer 31*a* and the second photoresist layer 32*a*, which are not irradiated by the UV light, are dissolved in the developer (as shown in FIG. 10) to expose regions of the upper conducting coat 21*a* and the lower conducting coat 22*a* respectively, which should be etched in following steps.

Figure 11:
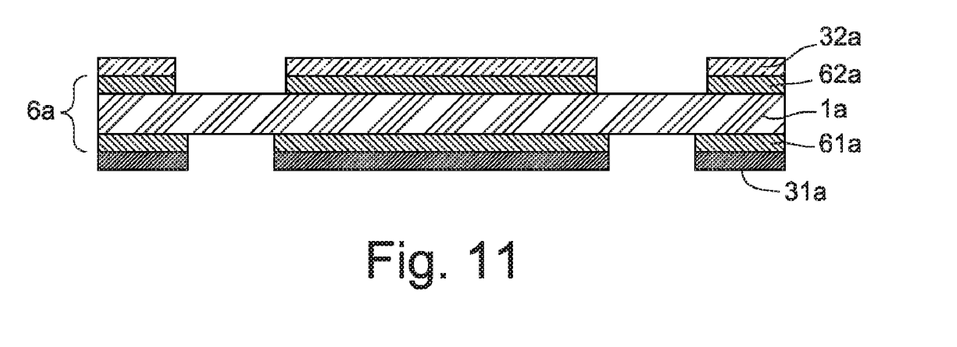
FIG. 11 is a schematic, crossed view of the manufacturing method, which etch the first and second conducting coats to form first and second conducting films.

Step (6) is immersing the transparent substrate 1*a* into an etchant to etch the conducting coats on the two surfaces of the transparent substrate 1*a* at the same time. Thus the exposed regions of the upper conducting coat 21*a* and the lower conducting coat 22*a* are dissolved in the etchant (as shown in FIG. 11) to form a first conducting film of a touch control circuit 6*a* from the upper conducting coat 21*a* and form a second conducting film of the touch control circuit 6*a* from the lower conducting coat 22*a*. In this exemplary embodiment, the first conducting film is an upper conducting film 61*a* from the upper conducting coat 21*a*, and the second conducting film is a lower conducting film 62*a* from the lower conducting coat 22*a*.

Figure 12:
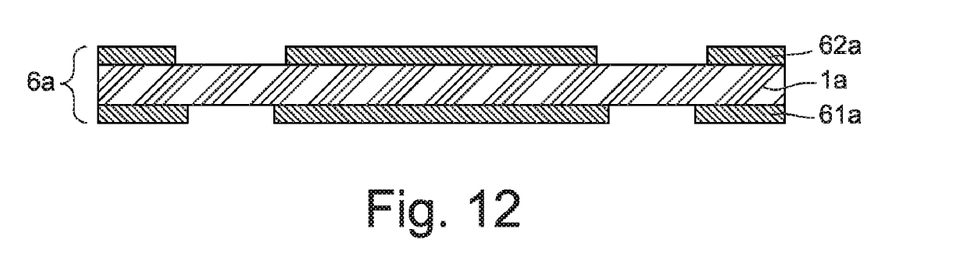
FIG. 12 is a schematic, crossed view of the manufacturing method, which remove the residual first and second photoresist layers to expose completely the first and second conducting films.

Step (7) is contacting the residual photoresist layer 31*a* on the upper conducting film 61*a* and the residual photoresist layer 32*a* on the lower conducting film 62*a* with an photoresist-removing solvent to remove the residual first and second photoresist layers 31*a* and 32*a* on the upper and lower conducting films 61*a* and 62*a* at the same time, and expose completely the upper conducting film 61*a* and the lower conducting film 62*a* (as shown in FIG. 12).

Therefore, the conducting films 61*a* and 62*a* on the two surfaces of the transparent substrate 1*a* are formed in a single developing and etching process, thus the manufacturing steps of the touch control circuit 6*a* are decreased and the manufacturing time is decreased.

Furthermore, the first surface of the transparent substrate may be the bottom surface of the transparent substrate. The first conducting coat may be the lower conducting coat formed on the bottom surface of the transparent substrate to from the lower conducting film of the touch control circuit. The second surface of the transparent substrate may be the top surface of the transparent substrate, and the second conducting coat may be the upper conducting coat formed on the top surface of the transparent substrate to form the upper conducting film of the touch control circuit.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A manufacturing method for conducting films on two opposite surfaces of a transparent substrate of a touch control circuit, comprising:

contacting a first photoresist layer having photosensitive and discolored emulsion on a first conducting coat formed on a first surface of the transparent substrate, and contacting a second photoresist layer on a second conducting coat formed on a second surface of the transparent substrate;

exposing the first photoresist layer to form a circuit pattern with distinguishable color on exposed regions of the first photoresist layer;

employing the circuit pattern as an aligning benchmark for the second photoresist layer, and exposing the second photoresist layer according to the aligning benchmark;

developing the photoresist layers on the two surfaces of the transparent substrate at the same time to expose regions of the first conducting coat and the second conducting coat, which should be etched;

etching the exposed regions of the first conducting coat and the second conducting coat at the same time to form a first conducting film of a touch control circuit from the first conducting coat and form a second conducting film of the touch control circuit from the second conducting coat.

2. The manufacturing method as claimed in claim 1, wherein the transparent substrate is one of an transparent substrate of a touch panel and an upper transparent substrate of a display panel.

3. The manufacturing method as claimed in claim 1, wherein the first and second photoresist layer are made of one of positive photoresist and negative photoresist.

4. The manufacturing method as claimed in claim 1, wherein the first conducting coat and the second conducting coat are made of transparent conducting material.

5. The manufacturing method as claimed in claim 1, wherein the first photoresist layer is shielded by a first mask having a first empty circuit pattern to be exposed by UV light; the second photoresist layer is shielded by a second mask having a second empty circuit pattern to be exposed by the UV light, and the circuit pattern is defined as the aligning benchmark of the second photoresist layer and the second mask.

6. The manufacturing method as claimed in claim 5, wherein the first photoresist layer and the second photoresist layer are exposed respectively.

7. The manufacturing method as claimed in claim 1, further comprising: removing residual first and second photoresist layers by an photoresist-removing solvent at the same time after forming the first conducting film and the second conducting film, to expose completely the first conducting film and the second conducting film.

8. The manufacturing method as claimed in claim 1, wherein the photosensitive and discolored emulsion is made of organic double band alkenes material.

9. The manufacturing method as claimed in claim 1, wherein the first surface of the transparent substrate is a top surface of the transparent substrate, the first conducting coat is an upper conducting coat formed on the top surface of the transparent substrate to form an upper conducting film of the touch control circuit, the second surface of the transparent substrate is a bottom surface of the transparent substrate, and the second conducting coat is a lower conducting coat formed on the bottom surface of the transparent substrate to form a lower conducting film of the touch control circuit.

10. The manufacturing method as claimed in claim 1, wherein the first surface of the transparent substrate is a bottom surface of the transparent substrate, the first conducting coat is a lower conducting coat formed on the bottom surface of the transparent substrate to form a lower conducting film of the touch control circuit; the second surface of the transparent substrate is a top surface of the transparent substrate, and the second conducting coat is an upper conducting coat formed on the top surface of the transparent substrate to form an upper conducting film of the touch control circuit.

* * * * *